US008426543B2

(12) United States Patent
Asai et al.

(10) Patent No.: US 8,426,543 B2
(45) Date of Patent: *Apr. 23, 2013

(54) ADHESIVE COMPOSITION AND ADHESIVE FILM

(75) Inventors: Takahiro Asai, Kawasaki (JP); Koichi Misumi, Kawasaki (JP); Atsushi Miyanari, Kawasaki (JP); Yoshihiro Inao, Kawasaki (JP); Akihiko Nakamura, Kawasaki (JP)

(73) Assignee: Tokyo Ohka Kogyo Co., Ltd., Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/516,363

(22) PCT Filed: Sep. 27, 2007

(86) PCT No.: PCT/JP2007/068772
§ 371 (c)(1),
(2), (4) Date: May 27, 2009

(87) PCT Pub. No.: WO2008/065801
PCT Pub. Date: Jun. 5, 2008

(65) Prior Publication Data
US 2010/0069593 A1   Mar. 18, 2010

(30) Foreign Application Priority Data
Nov. 29, 2006   (JP) ................. 2006-322346

(51) Int. Cl.
*C08F 20/10* (2006.01)
(52) U.S. Cl.
USPC ............ 526/318.44; 428/355 AC; 428/355 R; 524/553; 524/556; 524/558; 524/559; 524/560; 524/561; 526/317.1; 526/318.45; 526/320; 526/326
(58) Field of Classification Search ............ 428/355 AC, 428/355 R; 526/317.1, 318.44, 318.45, 320, 526/326; 524/553, 556, 558, 559, 560, 561
See application file for complete search history.

(56) References Cited

U.S. PATENT DOCUMENTS

| | | | |
|---|---|---|---|
| 4,243,500 A | 1/1981 | Glennon | |
| 4,693,776 A | 9/1987 | Krampe et al. | |
| 5,573,778 A | 11/1996 | Therriault et al. | |
| 5,798,426 A * | 8/1998 | Anton et al. ............ | 526/318.41 |
| 6,080,480 A | 6/2000 | Shiba et al. | |
| 6,337,288 B1 | 1/2002 | Ohya et al. | |
| 6,432,475 B1 | 8/2002 | Yamamoto et al. | |
| 6,489,396 B2 | 12/2002 | Nakamura et al. | |
| 7,097,959 B1 | 8/2006 | Ryu et al. | |
| 7,262,242 B2 | 8/2007 | Gielens et al. | |
| 2002/0091197 A1 | 7/2002 | Nakamura et al. | |
| 2002/0098352 A1 | 7/2002 | Kishioka | |
| 2002/0127821 A1 | 9/2002 | Ohya et al. | |
| 2004/0043236 A1 * | 3/2004 | Kugo et al. ............ | 428/500 |
| 2004/0202879 A1 * | 10/2004 | Xia et al. ............ | 428/500 |
| 2005/0075444 A1 | 4/2005 | Tosaki et al. | |
| 2005/0170612 A1 | 8/2005 | Miyanari et al. | |
| 2005/0182150 A1 | 8/2005 | Bamborough et al. | |
| 2005/0182186 A1 * | 8/2005 | Gielens et al. ............ | 524/523 |
| 2005/0261433 A1 | 11/2005 | Takeko et al. | |
| 2009/0137760 A1 | 5/2009 | Misumi et al. | |

FOREIGN PATENT DOCUMENTS

| | | |
|---|---|---|
| JP | 61-158145 | 7/1986 |
| JP | 02-003483 | 1/1990 |
| JP | 07-233356 | 9/1995 |
| JP | 7-268037 | 10/1995 |
| JP | 2001-279208 | 10/2001 |
| JP | 2003-173993 | 6/2003 |
| JP | 2003-292931 | 10/2003 |
| JP | 2003-313518 | 11/2003 |
| JP | 2007-119646 | 5/2007 |
| JP | 2008-038039 | 2/2008 |
| JP | 2008-063463 | 3/2008 |

OTHER PUBLICATIONS

International Search Report and Written Opinion for corresponding application No. PCT/JP2007/068772 issued Jan. 8, 2008.
U.S. Office Action mailed on Sep. 23, 2011 for co-pending U.S. Appl. No. 12/683,688.
U.S. Office Action mailed on Apr. 5, 2011 for co-pending U.S. Appl. No. 12/683,688.
U.S. Office Action mailed on Nov. 16, 2010 for co-pending U.S. Appl. No. 12/654,840.
U.S. Office Action mailed on Apr. 21, 2011 for co-pending U.S. Appl. No. 12/654,840.
U.S. Office Action mailed on Jun. 30, 2011 for co-pending U.S. Appl. No. 12/654,840.
International Search Report for corresponding Application No. PCT/JP2007/068668 issued Jan. 8, 2008.
Japanese Office Action for corresponding Japanese Application No. 2006-322346 mailed Apr. 10, 2012.
U.S. Office Action mailed on Jun. 23, 2011 for copending U.S. Appl. No. 12/514,633, now U.S. Patent No. 8,148,457.
U.S. Office Action mailed on Nov. 29, 2011 for copending U.S. Appl. No. 12/514,633, now U.S. Patent No. 8,148,457.

* cited by examiner

*Primary Examiner* — David W Wu
*Assistant Examiner* — Marie Reddick
(74) *Attorney, Agent, or Firm* — Renner, Otto, Boisselle & Sklar, LLP (57) ABSTRACT

An adhesive composition of the present invention includes, as a main component, a polymer produced by copolymerization of a monomer composition including: styrene; a (meth)acrylic acid alkyl ester having a chain structure; a (meth)acrylic acid ester having an aliphatic ring; and a (meth)acrylic acid ester having an aromatic ring, wherein: the styrene is contained in a range of 40 to 69 parts by mass; the (meth)acrylic acid alkyl ester having the chain structure is contained in a range of 20 to 30 parts by mass; the (meth)acrylic acid ester having the aliphatic ring is contained in a range of 10 to 25 parts by mass; and the (meth)acrylic acid ester having the aromatic ring is contained in a range of 1 to 5 parts by mass, where the total amount of the above components is 100 parts by mass. This allows for provision of an adhesive composition having high adhesive strength under high-temperature environment, as well as high heat resistance, high alkali resistance, and easiness in stripping from semiconductor wafers and the like even after high-temperature processing.

11 Claims, 1 Drawing Sheet

ADHESIVE COMPOSITION AND ADHESIVE FILM

TECHNICAL FIELD

The present invention relates to an adhesive composition and an adhesive film. More particularly, the present invention relates to an adhesive composition and an adhesive film used to temporarily fix a sheet or a protection board to a semiconductor product such as a semiconductor wafer or an optical product during a process in which such a product is processed, e.g., grinded.

BACKGROUND ART

In recent years, due to multiple functioning of mobile phones, digital AV devices, IC cards, and the like, demands have been increasing for downsizing, reduction in thickness, and high integration of semiconductor silicon chips (hereinafter referred to as "chips"). For example, the reduction of thickness is demanded for integrated circuits in which a plurality of chips are integrated, as typified by CSP (chip size package) and MCP (multi-chip package). Among these integrated circuits, a system-in-package (SiP) in which a plurality of semiconductor chips are mounted in a single semiconductor package has become an extremely important technique in order to accomplish downsizing, reduction in thickness, and high integration of chips that are installed in the semiconductor package. The downsizing, reduction in thickness and high integration enables realization of multiple functioning, downsizing, and reduction of weight of electronic devices.

In order to respond to the needs for a thin product, it is required to reduce the thickness of a chip to not more than 150 μm. Further, it is required to process the chip so that its thickness is reduced to not more than 100 μm for the CSP and the MCP, and not more than 50 μm for the IC card.

Conventionally, SiP products are manufactured by use of a method in which respective bumps (electrodes) provided on each of stacked chips are wired to a circuit board by a wire bonding technique. In order to respond to the demand for the reduction in thickness and high integration, a through-hole electrode technique is required, not the wire bonding technique. The through-hole electrode technique is a technique in which (i) chips each having a through-hole electrode are stacked and (ii) a bump is formed on a backside of the chips thus stacked.

A thin chip is manufactured by, for example, in a method as follows: (i) a high purity single crystal silicon or the like is sliced to a wafer form, (ii) a predetermined circuit pattern of an IC or the like is formed on a surface of the wafer by etching the surface of the wafer so that an integrated circuit is built, (iii) a back surface of the semiconductor wafer thus obtained is grinded by use of a grinder, and (iv) after the semiconductor wafer is grinded to a predetermined thickness, the semiconductor wafer is diced so as to form a chip shape. At this time, the predetermined thickness is around a range of 100 μm to 600 μm. Further, in a case where a through-hole electrode is to be formed, the wafer is grinded to a thickness of around a range of 50 μm to 100 μm.

In the manufacture of the semiconductor chip, the semiconductor wafer readily breaks in a case where external force is given to the wafer in the grinding step or at the time when the wafer is carried to the dicing step. This is because the semiconductor wafer is thin and fragile, and because circuit patterns are unlevel. Moreover, in the grinding step, purified water is used to clean the back surface of the semiconductor wafer for removing grinding dust and heat generated at the time of grinding, while grinding process is carried out. At this time, there is the need to prevent contamination of a circuit pattern surface due to the purified water used in cleaning.

Accordingly, in order to protect the circuit pattern surface of the semiconductor wafer and prevent breakage of the semiconductor wafer, a film adhesive for processing is attached on the circuit pattern surface while the grinding process is carried out.

Moreover, at the time of the dicing, the semiconductor wafer is diced in a state in which a protection sheet is attached to a back surface of the semiconductor wafer so that the semiconductor wafer is fixed. Chips obtained by the dicing are pushed up by use of a needle from a film base material side, and are fixed on a die pad.

Known types of film adhesives for processing and protection sheets as such include, for example, ones in which an adhesive layer made of an adhesive composition is provided on a base material film such as polyethylene terephthalate (PET), polyethylene (PE), polypropylene (PP), or ethylene-vinyl acetate copolymer (EVA) (for example, Patent Literature 1, Patent Literature 2, and Patent Literature 3).

An arrangement has also been disclosed (Patent Literature 4) in which a protection board is used instead of using the film adhesive for processing or the protection sheet. The protection board is an aluminum nitride-boron nitride pore sintered body impregnated with ladder-type silicone oligomer. In the arrangement, this protection board and the semiconductor wafer are adhered together by use of a thermoplastic film. There is also a method in which a material such as alumina, aluminum nitride, boron nitride, or silicon carbide, each of which has substantially the same thermal expansivity as the semiconductor wafer, is used as the protection board, and thermoplastic resin such as polyimide is used as an adhesive for attaching the protection board to the semiconductor wafer (Patent Literature 5). This method suggests applying the adhesive in a form of a film having a thickness in a range of 10 μm to 100 μm. As a method for forming the film, the method of Patent Literature 5 suggests that an adhesive composition is applied by spin coating and then dried so that an obtained film has a thickness of not more than 20 μm.

Moreover, due to multilayer interconnection of semiconductor elements, a process is conducted such that: (i) a protection board is adhered, by use of the adhesive composition, to a surface of the semiconductor wafer on which a circuit is formed; (ii) a back surface of the semiconductor wafer is polished; (iii) the back surface thus polished is etched to form a mirror plane; and (iv) a back surface circuit is formed on the mirror plane. In this case, the protection board is adhered to the semiconductor wafer until the back surface circuit is formed (Patent Literature 6).

CITATION LIST

Patent Literature 1
Japanese Patent Application Publication, Tokukai No. 2003-173993 A (Publication Date: Jun. 20, 2003)
Patent Literature 2
Japanese Patent Application Publication, Tokukai No. 2001-279208 A (Publication Date: Oct. 10, 2001)
Patent Literature 3
Japanese Patent Application Publication, Tokukai No. 2003-292931 A (Publication Date: Oct. 15, 2003)
Patent Literature 4
Japanese Patent Application Publication, Tokukai No. 2002-203821 A (Publication Date: Jul. 19, 2002)

Patent Literature 5

Japanese Patent Application Publication, Tokukai No. 2001-77304 A (Publication Date: Mar. 23, 2001)

Patent Literature 6

Japanese Patent Application Publication, Tokukaishou No. 61-158145 A (Publication Date: Jul. 17, 1986)

SUMMARY OF INVENTION

However, the following problems occur in a case where the conventional film adhesive for processing and the like are used in steps which require high temperature processing and high vacuum processing, as like in formation of the through-hole electrode: a problem of poor adhesion caused by insufficient adhesive strength in a high temperature environment or generation of gas in a high vacuum environment; or a problem of poor stripping such as residue remaining at the time of stripping following the high temperature processing.

For example, in the formation of the through-hole electrode, when semiconductor chips are connected to each other after formation of a bump on each of the semiconductor chips, a process is required which applies heat to the semiconductor chips to approximately 200° C., and further has the semiconductor chips to be in a high vacuum state. However, the adhesive composition which constructs an adhesive layer of a protection tape according to Patent Literatures 1 and 2 has no resistance against such a high temperature of 200° C. Moreover, gas is generated due to application of heat. This gas causes the poor adhesion.

The thin semiconductor wafer requires to be stripped off from the protection board after the grinding and dicing. However, the adhesive composition which constructs an adhesive layer of a protection tape disclosed in Patent Literature 3 is an epoxy resin composition. At a high temperature of 200° C., the epoxy resin changes in quality and cures. This causes residue to remain at the time of stripping, thereby causing poor stripping.

Further, in the thermoplastic film used for adhering a protection board to a semiconductor wafer in Patent Literatures 4 and 5, gas derived from absorbed moisture is generated. This causes the problem of poor adhesion. The processing method of the semiconductor substrate according to Patent Literature 6 carries out a mirror surfacing process by use of an etching liquid and formation of a metal film by vacuum plating. In order to carry out these processes, the adhesive composition for adhering a protection board to a semiconductor wafer requires heat resistance and stripping property. However, Patent Literature 6 includes no disclosure regarding formation of the adhesive composition.

A study conducted by inventors of the present invention resulted in that, in processings of a semiconductor wafer and a chip, an adhesive which uses an acrylic resin material is preferably used, due to its crack resistance. However, the inventors found that the following problems occur even when the adhesive which uses such acrylic resin material is used:

(1) Adhesive strength is weak in a high temperature environment, due to an occurrence of a bubble-form strip on an adhesive surface at the time when the adhesive layer and the protection board are thermally compressed together, caused by generation of gas from moisture absorbed by the adhesive layer. Such generation of gas causes problems, not only that the adhesive strength is weakened in the high temperature environment, but also difficulty in production and maintenance of a vacuum environment in a case where processing is carried out under vacuum conditions.

(2) In a case where there is a step at which a semiconductor wafer has contact with an alkaline liquid such as an alkaline slurry or an alkaline developer, a contact surface of the adhesive composition deteriorates due to stripping, melting, diffusion or the like caused by the alkaline liquid.

(3) In a case where the adhesive is heated to approximately 200° C., the adhesive composition changes in quality due to low heat resistance. This causes poor stripping such as formation of insoluble substance in a stripping solution.

The present invention is accomplished in view of the above problems. An object of the present invention is to provide an adhesive composition (i) which has high adhesive strength in a high temperature environment, especially at a temperature of 140° C. to 200° C., high heat resistance, and high alkaline resistance, and (ii) which can be easily stripped off from a semiconductor wafer and a chip even after the adhesive composition is processed in a high temperature environment and/or in a high vacuum environment (hereinafter, simply referred to as a "high temperature process").

A first mode of the present invention is an adhesive composition including, as a main component, a polymer produced by copolymerization of a monomer composition including: styrene; a (meth)acrylic acid alkyl ester having a chain structure; a (meth)acrylic acid ester having an aliphatic ring; and a (meth)acrylic acid ester having an aromatic ring, wherein: the styrene is contained in a range of 40 to 69 parts by mass; the (meth)acrylic acid alkyl ester having the chain structure is contained in a range of 20 to 30 parts by mass; the (meth)acrylic acid ester having the aliphatic ring is contained in a range of 10 to 25 parts by mass; and the (meth)acrylic acid ester having the aromatic ring is contained in a range of 1 to 5 parts by mass, where a total amount of styrene, the (meth)acrylic acid alkyl ester having the chain structure, the (meth)acrylic acid ester having the aliphatic ring, and the (meth)acrylic acid ester having the aromatic ring is 100 parts by mass.

A second mode of the present invention is an adhesive film including, on a film, an adhesive layer including the adhesive composition.

Additional objects, features, and strengths of the present invention will be made clear by the description below. Further, the advantages of the present invention will be evident from the following explanation in reference to the drawings.

DESCRIPTION OF EMBODIMENTS

One embodiment of the present invention will be described below. The scope of the present invention is not limited to the descriptions. The present invention may be implemented with proper alterations, apart from the illustrations below, within the intent of the present invention.

[Adhesive Composition]

An adhesive composition of the present embodiment includes, as a main component, a polymer produced by copolymerization of a monomer composition including: styrene; a (meth)acrylic acid alkyl ester having a chain structure; a (meth)acrylic acid ester having an aliphatic ring; and a (meth)acrylic acid ester having an aromatic ring, wherein: the styrene is contained in a range of 40 to 69 parts by mass; the (meth)acrylic acid alkyl ester having the chain structure is contained in a range of 20 to 30 parts by mass; the (meth) acrylic acid ester having the aliphatic ring is contained in a range of 10 to 25 parts by mass; and the (meth)acrylic acid ester having the aromatic ring is contained in a range of 1 to 5 parts by mass, where a total amount of styrene, the (meth) acrylic acid alkyl ester having the chain structure, the (meth) acrylic acid ester having the aliphatic ring, and the (meth) acrylic acid ester having the aromatic ring is 100 parts by mass.

The inclusion of the (meth)acrylic acid ester having an aliphatic ring in the monomer composition raises the glass transition temperature of the adhesive composition to be obtained. This allows for provision of an adhesive composition having high adhesive strength under high-temperature environment. Further, composing the other components as above allows the adhesive composition to have high heat resistance and high alkali resistance, and to be readily stripped off after high-temperature processing.

Specifically, the adhesiveness under high-temperature environment is improved by reducing the contents of components that lower the glass transition temperature and increasing the content of a component that raises the glass transition temperature. Merely increasing the content of a component that raises the glass transition temperature may instead lead to a decrease in other properties such as heat resistance, alkali resistance, flexibility, moisture absorbency, and easiness in stripping. However, as a result of diligent examination, the inventors of the present invention have first found that the inclusion of the components of the above kinds in the above contents in the monomer composition allows for improvement in not only the adhesiveness under high-temperature environment, but also such properties as heat resistance. The adhesive composition of the present invention has been invented on the basis of this entirely new knowledge.

The "main component" in the present specification denotes that an amount of such component contained is more than any of other components contained in the adhesive composition. The amount of the main component contained is not limited as long as it is the most among all of the components that are contained in the adhesive composition. However, where an entire mass of the adhesive composition is 100 parts by mass, the amount of the main component contained is preferably in a range of not less than 50 parts by mass but not more than 100 parts by mass, and is further preferably in a range of not less than 70 parts by mass but not more than 100 parts by mass. The amount of the main component contained by not less than 50 parts by mass allows sufficient demonstration of an effect in accordance with the high heat resistance, high adhesive strength in a high temperature environment, alkaline resistance and easiness in stripping, each of which are properties of the adhesive composition.

[Styrene]

The adhesive composition according to the present embodiment contains styrene in the monomer composition. Properties of the styrene do not change even in a high temperature environment of not less than 200° C. This allows improvement in heat resistance of the adhesive composition.

The styrene included in the monomer composition only needs to be contained in the range of 40 to 69 parts by mass, is preferably contained in the range of 45 to 65 parts by mass, and is most preferably contained in the range of 50 to 60 parts by mass, where the total amount of the styrene, the (meth) acrylic acid alkyl ester having a chain structure, the (meth) acrylic acid ester having an aliphatic ring, and the (meth) acrylic acid ester having an aromatic ring is 100 parts by mass. The mass of not less than 40 parts by mass improves the heat resistance, while that of not more than 69 parts by mass prevents decrease in the crack resistance.

[(Meth)acrylic Acid Alkyl Ester Having a Chain Structure]

The adhesive composition according to the present invention includes, in the monomer composition, a (meth)acrylic acid alkyl ester having a chain structure. This improves the flexibility and crack resistance of an adhesive layer made of the adhesive composition.

The (meth)acrylic acid alkyl ester having a chain structure included in the monomer composition only needs to be contained in the range of 20 to 30 parts by mass, and is preferably contained in the range of 25 to 30 parts by mass, where the total amount of the styrene, the (meth)acrylic acid alkyl ester having a chain structure, the (meth)acrylic acid ester having an aliphatic ring, and the (meth)acrylic acid ester having an aromatic ring is 100 parts by mass. The mass of not less than 20 parts by mass improves the flexibility and crack resistance of an adhesive layer to be obtained, while that of not more than 30 parts by mass suppresses decrease in the heat resistance, poor stripping, and moisture absorbency.

The (meth)acrylic acid alkyl ester having a chain structure included in the monomer composition is not particularly limited to a specific one; it may, for example, be an acrylic long-chain alkyl ester having a C15 to C20 alkyl group, or an acrylic alkyl ester having a C1 to C14 alkyl group.

Examples of the above acrylic long-chain alkyl ester encompass an acrylic acid alkyl ester or methacrylic acid alkyl ester having an alkyl group such as an n-pentadecyl group, an n-hexadecyl group, an n-heptadecyl group, an n-octadecyl group, an n-nonadecyl group, and an n-eicosyl group. The alkyl group may also be branched.

Examples of the acrylic alkyl ester having a C1 to C14 alkyl group encompass known acrylic alkyl esters for use in existing acrylic adhesive agents. Specifically, such examples encompass an acrylic acid alkyl ester or a methacrylic acid alkyl ester having an alkyl group such as a methyl group, an ethyl group, a propyl group, a butyl group, a 2-ethylhexyl group, an isooctyl group, an isononyl group, an isodecyl group, a dodecyl group, a lauryl group, a tridecyl group or the like.

Any one of these alkyl esters may be used independently, or two or more of them may be used in proper combination. The (meth)acrylic acid alkyl ester having a chain structure included in the monomer composition preferably includes a compound having a structure represented by the following general formula (1):

Chem. 1

(1)

where $R^1$ is a hydrogen atom or a methyl group; and $R^2$ is a C1 to C3 alkyl group, and more preferably includes a methyl (meth)acrylic acid. The mixing of the compound having a structure represented by the above general formula (1) in the monomer composition further raises the glass transition temperature of the adhesive composition to be obtained. This allows for provision of an adhesive composition having higher adhesive strength under high-temperature environment.

There is no specific limit to the mass of the compound having a structure represented by the above general formula (1), included in the monomer composition. The compound is preferably contained in the range of 50 to 100 parts by mass, is more preferably contained in the range of 70 to 100 parts by mass, and is even more preferably contained at 100 parts by mass, where the total amount of the (meth)acrylic acid alkyl ester having a chain structure included in the monomer composition is 100 parts by mass. The mass of not less than 50 parts by mass further raises the glass transition temperature of the adhesive composition to be obtained and thereby allows for provision of an adhesive composition having higher adhesive strength under high-temperature environment.

((Meth)acrylic Acid Ester Having an Aliphatic Ring)]

The adhesive composition according to the present invention includes, in the monomer composition, a (meth)acrylic acid ester having an aliphatic ring. The inclusion of the (meth)acrylic acid ester having an aliphatic ring raises the glass transition temperature of the adhesive composition to be obtained and thereby allows for provision of an adhesive composition having high adhesive strength under high-temperature environment.

The (meth)acrylic acid ester having an aliphatic ring included in the monomer composition only needs to be contained in the range of 10 to 25 parts by mass, and is preferably contained in the range of 15 to 20 parts by mass, where the total amount of the styrene, the (meth)acrylic acid alkyl ester having a chain structure, the (meth)acrylic acid ester having an aliphatic ring, and the (meth)acrylic acid ester having an aromatic ring is 100 parts by mass. The mass of not less than 10 parts by mass allows for improvement in the heat resistance of the adhesive agent to be obtained, while that of not more than 25 parts by mass allows for a favorable stripping property.

The term "aliphatic ring" as used in the present specification is a concept relative to an aromatic ring described below and is intended to refer to the cyclic structure lacking an aromatic ring (benzene ring).

The (meth)acrylic acid ester having an aliphatic ring included in the monomer composition is not particularly limited to a specific one. It is preferably a compound represented by the following general formula (2):

Chem. 2

(2)

where $R^3$ is a hydrogen atom or a methyl group; and $R^4$ is an organic group having a C4 to C15 aliphatic ring.

Examples of the compound represented by the above general formula (2) encompass cyclohexyl(meth)acrylate, cyclopentyl(meth)acrylate, 1-adamantyl(meth)acrylate, norbornyl (meth)acrylate, isobornyl(meth)acrylate, tricyclodecanyl (meth)acrylate, and tetracyclododecanyl(meth)acrylate. The compound is preferably isobornyl methacrylate. The mixing of the compound having a structure represented by the above general formula (2) in the monomer composition further raises the glass transition temperature of the adhesive composition to be obtained. This allows for provision of an adhesive composition having higher adhesive strength under high-temperature environment.

((Meth)acrylic Acid Ester Having an Aromatic Ring)

The adhesive composition according to the present invention includes, in the monomer composition, a (meth)acrylic acid ester having an aromatic ring. The inclusion of the (meth)acrylic acid ester having an aromatic ring improves the flexibility of the adhesive composition to be obtained.

The (meth)acrylic acid ester having an aromatic ring included in the monomer composition only needs to be contained in the range of 1 to 5 parts by mass, and is preferably contained in the range of 3 to 5 parts by mass, where the total amount of the styrene, the (meth)acrylic acid alkyl ester having a chain structure, the (meth)acrylic acid ester having an aliphatic ring, and the (meth)acrylic acid ester having an aromatic ring is 100 parts by mass. The mass of not less than 1 part by mass improves the flexibility of the adhesive agent to be obtained. The inclusion of the (meth)acrylic acid ester having an aromatic ring in the monomer composition lowers the glass transition temperature of the adhesive composition to be obtained. In view of this, the mass of the (meth)acrylic acid ester having an aromatic ring being not more than 5 parts by mass not only ensures the flexibility as described above, but also suppresses decrease in the glass transition temperature of the adhesive composition to be obtained, thereby allowing for provision of an adhesive composition having high adhesive strength under high-temperature environment.

The (meth)acrylic acid ester having an aromatic ring included in the monomer composition is not particularly limited to a specific one. It is preferably a compound represented by the following general formula (3):

Chem. 3

(3)

where $R^5$ is a hydrogen atom or a methyl group; and $R^6$ is an organic group having a C6 to C15 aromatic ring.

Examples of the organic group having a C6 to C15 aromatic ring encompass a phenyl group, a benzyl group, a tolyl group, a xylyl group, a biphenyl group, a naphthyl group, an anthracenyl group, a phenoxymethyl group, and a phenoxyethyl group. The aromatic ring may include a chained or branched C1 to C5 alkyl group. Among other components represented by the above general formula (3), phenoxyethyl acrylate is more preferable. The use of the compound represented by the above general formula (3) allows for further improvement in the flexibility of the adhesive composition to be obtained. Specifically, a small amount of the compound provides flexibility as desired. This allows for increase in the amount of the component that raises the glass transition temperature of the adhesive composition and for provision of an adhesive composition having high flexibility and high adhesive strength under high-temperature environment.

(Carboxylic Acid Having an Ethylenic Double Bond)

The monomer composition may include a carboxylic acid having an ethylenic double bond. The inclusion of the carboxylic acid having an ethylenic double bond improves the adhesive strength under high-temperature environment and heat resistance of the adhesive composition to be obtained. In addition, such an adhesive composition can easily be stripped off even after high-temperature processing.

This is because an increase in the hydroxyl group (polar group) derived from the carboxylic acid in the adhesive composition improves the polarity of the adhesive composition along the interface between the adherend to which the adhesive composition is applied and the adhesive composition, thereby suppressing dissociation of molecular chains in the adhesive composition under high-temperature environment.

The carboxylic acid is not limited to a specific one, provided that it has an ethylenic double bond and is capable of copolymerizing with other monomer components. The carboxylic acid is preferably a carboxylic acid represented by the following general formula (4):

Chem. 4

(4)

where $R^7$ is a C2 to C20 organic group having a (meth) acryloyl group or a vinyl group. It may also contain an oxygen atom; m represents an integer of 1 to 3.

The carboxylic acid is more preferably a (meth)acrylic acid, or a carboxylic acid represented by the following general formula (5):

Chem. 5

(5)

where $R^8$ is a hydrogen atom or an C1 to C4 alkyl group; $R^9$ is a divalent C1 to C5 alkylene group or a divalent C4 to C20 organic group having a cyclic structure. $R^9$ may also contain an oxygen atom.

Examples of the carboxylic acid represented by the above general formula (5) encompass carboxylic acids whose $R^9$ preferably includes a group having cyclohexane, norbornane, tricyclodecane, or tetracyclododecane, each with two hydrogen atoms removed. Any one of the carboxylic acids may be used independently, or two or more of them may be mixed for use. Among others, a (meth)acrylic acid is preferable. These carboxylic acids favorably copolymerize with other components included in the monomer composition, and also the polymer structure achieved after the copolymerization is stable. This suppresses dissociation of molecular chains and consequently improves the heat resistance and the adhesive strength under high-temperature environment.

The amount of the carboxylic acid may be set as appropriate in accordance with desired properties of the adhesive composition such as adhesive strength. The amount is preferably in the range of 1 to 10 parts by mass, and is more preferably in the range of 1 to 5 parts by mass, where the total amount of the styrene, the (meth)acrylic acid alkyl ester having a chain structure, the (meth)acrylic acid ester having an aliphatic ring, and the (meth)acrylic acid ester having an aromatic ring is 100 parts by mass. The amount of not less than 1 part by mass further improves the heat resistance, as well as the adhesive strength under high-temperature environment, of the adhesive composition to be obtained. The amount of not more than 10 parts by mass suppresses moisture absorbency of the adhesive composition, thereby preventing gelling of the adhesive composition. Reduction in the amount of the carboxyl group included in the adhesive composition improves the alkali resistance as well.

(Other Components)

The adhesive composition according to the present embodiment may contain acrylamide such as dimethyl acrylamide and morpholine such as acryloylmorpholine, as an other additive component. Containing of such an additive component allows concurrent improvement of the heat resistance and adhesiveness.

The adhesive composition according to the present embodiment may further include, to an extent in which essential properties of the present invention is not lost, miscible additives, for example, a commonly used addition resin, plasticizing agent, adhesive auxiliary agent, stabilization agent, coloring agent, and surface active agent, each of which improves effectiveness of the adhesive.

Further, the adhesive composition may be diluted by use of an organic solvent for adjusting viscosity of the adhesive composition, in the extent in which the essential properties of the present invention is not lost. Examples of the organic solvent encompass: ketones such as acetone, methyl ethyl ketone, cyclohexanone, methyl isoamyl ketone, and 2-heptanone; polyhydric alcohols and derivatives thereof such as monomethyl ethers, monoethyl ethers, monopropyl ethers, monobutyl ethers, or monophenyl ethers of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxy propionate, and ethyl methoxy propionate. These organic solvents may be used solely, or two or more of the organic solvents may be used in combination. Particularly, it is preferable to use the polyhydric alcohols and derivatives thereof such as the monomethyl ethers, monoethyl ethers, monopropyl ethers, monobutyl ethers, and monophenyl ethers of ethylene glycol, ethylene glycol monoacetate, diethylene glycol, diethylene glycol monoacetate, propylene glycol, propylene glycol monoacetate, dipropylene glycol, or dipropylene glycol monoacetate.

An amount of the organic solvent used is set as appropriate in accordance with a film thickness of the adhesive composition to be applied, and is not particularly limited as long as the adhesive composition is in a concentration which is applicable to a supporting body such as a semiconductor wafer or the like. Generally, the adhesive composition is used so that a solid content concentration is in a range of 20 mass % to 70 mass %, and preferably in a range of 25 mass % to 60 mass %.

[Copolymerization Reaction]

The adhesive composition of the present embodiment may be produced by carrying out copolymerization reaction of the monomer composition. A method for copolymerizing the monomer composition is not especially limited, and the copolymerization reaction of the monomer composition may be carried out by stirring the monomer composition by use of an existing stirring device stirring device.

A temperature condition of the copolymerization reaction may be set as appropriate, and is not limited. However, the temperature is preferably in a range of 60 to 150° C., further preferably in a range of 70 to 120° C.

In the copolymerization reaction, a solvent may be used as appropriate. The aforementioned organic solvents can be used as the solvent. Among the aforementioned organic solvents, propylene glycol monomethyl ether acetate (hereinafter, referred to as "PGMEA") is preferable.

In the copolymerization reaction according to the present embodiment, a polymerization initiator may be used as appropriate. Examples of the polymerization initiator encompass: azo compounds such as 2,2'-azobisisobutylonitrile, 2,2'-azobis(2-methylbutylonitrile), dimethyl 2,2'-azobis isobutyrate, 1,1'-azobis(cyclohexane-1-carbonitrile), and 4,4'-azobis(4-cyanovaleric acid); and organic peroxides such as decanoyl peroxide, lauroyl peroxide, benzoyl peroxide, bis (3,5,5-trimethyl hexanoyl) peroxide, succinic acid peroxide, t-butyl peroxy-2-ethylhexanoate, t-butyl peroxypivalate, and 1,1,3,3-tetramethylbutylperoxy-2-ethylhexanoate. These polymerization initiators may be used solely, or two or more of the polymerization initiators may be used in combination as appropriate. An amount of the polymerization initiator to be used may be set as appropriate in accordance with a combination of the monomer composition, reaction conditions, and the like, and is not particularly limited.

In the case of using the carboxylic acid having an ethylenic double bond, the timing for mixing the carboxylic acid having an ethylenic double bond is not limited provided that the carboxylic acid can be copolymerized with components other than the carboxylic acid in the monomer composition.

That is to say, the carboxylic acid may be preliminarily mixed with the components other than the carboxylic acid in the monomer composition before copolymerization reaction is initiated. Alternatively, the carboxylic acid may be mixed between initiation and termination of copolymerization reaction of the components other than the carboxylic acid. In particular, the carboxylic acid is preferably mixed with the styrene, the (meth)acrylic acid alkyl ester having a chain structure, the (meth)acrylic acid ester having an aliphatic ring, and the (meth)acrylic acid ester having an aromatic ring before the initiation of a copolymerization reaction. The copolymerization reaction of a monomer composition in which the carboxylic acid has been preliminarily mixed causes the carboxylic acid to be randomly copolymerized with the components other than the carboxylic acid. As a result, the aforementioned polar groups are uniformly formed in an obtained adhesive composition, thereby improving polarity of the adhesive composition on an interface between the adhesive composition and an adhered object. This further suppresses dissociation between molecular chains in the adhesive composition in a high temperature environment, thereby further improving the adhesive strength.

The "initiation of a copolymerization reaction" in the present specification denotes a point of time when a copolymerization reaction initiates in the monomer composition constituted by mixture compounds other than a compound to be mixed after the initiation of the copolymerization reaction.

The production process may be controlled such that the "initiation of a copolymerization reaction" may be a point of time when mixing of components that are to be mixed in advance is completed in a case where production of the adhesive composition is actually conducted. Further, in a case where a reaction container equipped with a stirrer is used, the "initiation of a copolymerization reaction" may be a point of time when stirring is initiated after at least part of each of all components that are to be mixed in advance is added in the reaction container. Moreover, in a case where a predetermined reaction temperature of the copolymerization reaction is set, the "initiation of a copolymerization reaction" may be a point of time when heating is started for a temperature to reach the reaction temperature. Alternatively, in a case where the polymerization initiator is used, the "initiation of a copolymerization reaction" may be a point of time when the polymerization initiator is added.

The effect of the present invention is attainable regardless of which point of time is taken as the "initiation of a copolymerization reaction". Consequently, the "initiation of a copolymerization reaction" may be set in accordance with production equipment, conditions and the like of the adhesive composition as appropriate, and control may be carried out to subsequent steps and the like.

Further, in the present specification, "completion of the copolymerization reaction" denotes a point of time when a desired copolymerization reaction is attained. More specifically, the production of the adhesive composition is sufficiently carried out by taking the "completion of the copolymerization reaction" as a point of time when the stirring is stopped, or a point of time when cooling of the reaction temperature is started.

[Glass Transition Temperature]

The adhesive composition produced by copolymerization of the monomer composition described above has a high glass transition temperature and thus has high adhesive strength under high-temperature environment, as well as high heat resistance, high alkali resistance, and easiness in stripping after high-temperature processing.

The polymer serving as the main component of the adhesive composition of the present invention preferably has a glass transition temperature in the range of 50 to 100° C., and more preferably in the range of 65 to 95° C.

[Adhesive Film]

The adhesive composition according to the present embodiment as described above may be used in various ways depending on its purpose. For example, the adhesive composition in a liquid form may be applied on a processed body such as a semiconductor wafer so as to form an adhesive layer. Alternatively, a film adhesive according to the present invention, that is, a film such as a flexible film on which an adhesive layer containing any one of the foregoing adhesive compositions is formed in advance and dried, may be used by attaching this film (film adhesive) to the processed body (film adhesive method).

As such, the film adhesive according to the present invention includes a film, and an adhesive layer provided on the film, containing any one of the aforementioned adhesive compositions.

This allows for provision of an adhesive film having high adhesive strength under high-temperature environment, as well as high heat resistance, high alkali resistance, and superior easiness in stripping.

The film adhesive may be used such that a protection film is further provided on the adhesive layer. In this case, the adhesive layer is easily provided on a processed body by (i) stripping off the protection film which covers the adhesive layer; (ii) placing, on the processed body, the adhesive layer thus exposed, and (iii) stripping off the film from the adhesive layer.

Consequently, the use of the film adhesive allows formation of a layer having an even thickness and a good surface smoothness as compared to a case where the adhesive composition is directly applied on a processed body so as to form an adhesive layer.

The film to be used in manufacture of the film adhesive is not limited, as long as an adhesive layer formed on the film is strippable from the film and the film is a release film which can transfer the adhesive layer to a surface to be processed of a protection board, a wafer, or the like. An example of the film is a flexible film made of a synthetic resin film such as polyethylene terephthalate, polyethylene, polypropylene, polycarbonate or polyvinyl chloride, and having a thickness of 15 µm to 125 µm. It is preferable for the film to be strip-processed if necessary so that transfer can be readily carried out.

A well-known method may be appropriately used as a method for forming the adhesive layer on the film, in accordance with a desired thickness and evenness of the adhesive layer, and is not particularly limited to which method is used. For example, a method may be used in which the adhesive composition according to the present invention is applied on a film by use of an applicator, a bar coater, a wire bar coater, a roll coater, or a curtain flow coater, so that a dried thickness of the adhesive layer is in a range of 10 µm to 1000 µm. Among the coaters, the roll coater is preferable since the roll coater excels in evenness of the film thickness, and is capable of efficiently forming a thick film.

In a case where the protection film is to be used, the protection film to be used is not limited as long as the film is strippable from the adhesive layer. However, it is preferable for the protection film to be, for example, a polyethylene terephthalate film, a polypropylene film, or a polyethylene film. Moreover, the protective film is preferably coated with silicon or baked. This allows the protective film to be easily stripped off from the adhesive layer. A thickness of the protection film is not particularly limited, however is preferably in a range of 15 µm to 125 µm. This is because the adhesive film attached to the protective film can secure flexibility of the film adhesive.

A method of using the film adhesive is not particularly limited. For example, the following method may be taken in a case where the protection film is used: (i) the protection film is stripped off from the film adhesive, (ii) the adhesive layer thus exposed is placed on a surface of a processed body, and (iii) a heating roller is rolled on the film (back surface of the surface on which the adhesive layer is formed), so that the adhesive layer is thermally compressed onto the surface of the processed body. At this time, by sequentially rolling up the protection film on a reel roller or the like, the protection film that is stripped off from the film adhesive may be stored and reused.

The application of the adhesive composition and adhesive film of the present invention is not particularly limited to a specific one, provided that they are used for adhesion purposes. They are suitably used to attach protective substrates for high-precision processing of semiconductor wafers, to substrates such as semiconductor wafers. The adhesive composition of the present invention is particularly suitably used as an adhesive composition, when a substrate such as the semiconductor wafer is grinded so that a thickness of the substrate is reduced, for attaching the substrate to a support plate (see, for example, Japanese Patent Application Publication, Tokukai No. 2005-191550 A).

[Stripping Solution]

A commonly used stripping solution may be used as a stripping solution for removing the adhesive composition according to the present invention, however from a point of environmental burden and a stripping property, a stripping solution whose main component is PGMEA, ethyl acetate, or methyl ethyl ketone is preferably used.

EXAMPLES

The following description deals with examples in which the adhesive strength and the like of the adhesive composition of the present invention were evaluated.

Note that evaluations of adhesive compositions of the following Example and Comparative Example were carried out by measuring, for each of the adhesive compositions, (i) heat resistance, (ii) moisture absorbency, (iii) flexibility, (iv) adhesive strength in different temperature conditions, and (v) an amount of gas generated (hereinafter referred to as "generated gas") at a temperature of 200° C. Measuring methods of each of the items are explained below.

(How Heat Resistance, Moisture Absorbency, and Generated Gas Were Measured)

After applying adhesive compositions according to Examples 1 and 2 and Comparative Example 1 later described on silicon wafers, respectively, thus applied films were heated from 40° C. to 250° C. A degassing amount from each of the applied films was measured, and evaluation was made from the amount of gas thus measured.

Reasons why thermal resistance and moisture absorbency can be evaluated from the degassing amount are as follows. That is, the degassing amount measured until a temperature increased to 100° C., is an amount of gas derived from either water vapor or its azeotropic gas. The water vapor or the azeotropic gas is derived from moisture absorbed by the adhesive composition. Thus, it is possible to evaluate the moisture absorbency from the degassing amount measured until the temperature reached 100° C. The degassing amount measured at a temperature not less than 100° C. is derived from gas that has been generated due to decomposition of the adhesive composition caused by heat. Therefore, the thermal resistance can be evaluated from the degassing amount at a temperature of not less than 100° C., particularly around 200° C.

A TDS method (Thermal Desorption Spectroscopy method) was used for measuring the degassing amount. EMD-WA1000, manufactured by ESCO, Ltd. was used as a TDS measuring device (discharged gas measuring device).

A measuring condition of the TDS device was set as Width: 100; Center Mass Number: 50; Gain: 9; Scan Speed: 4; and Emult Volt: 1.3 KV.

The thermal resistance was evaluated at a temperature of 200° C. based on definitions as follows: "G (good)" indicates a case where a strength (Indensity) found by the TDS measuring device was not more than 100,000, and no residue was observed by a metallurgical microscope; "S (sufficient)" indicates a case where the Indensity was not less than 100,000, however no residue was observed by the metallurgical microscope; and "P (poor)" indicates a case where the Indensity was not less than 100,000 and a residue was observed by the metallurgical microscope.

The moisture absorbency was evaluated at a temperature of 100° C. based on definitions as follows: "G" indicates a case where the Indensity was not more than 10,000; and "P" indicates a case where the Indensity was not less than 10,000.

The generated gas was evaluated at a temperature of 200° C. based on definitions as follows: "G" indicates a case where the strength (Indensity) found by the TDS measuring device was not more than 100,000; and "P" indicates a case where the Indensity was not less than 100,000.

(Adhesive Strength)

After the adhesive compositions according to Examples 1 and 2 and Comparative Example 1 were applied on silicon wafers, respectively, the adhesive compositions were dried for three minutes at a temperature of 150° C. Next, a glass plate was adhered to each of the adhesive compositions at a temperature of 200° C. and with a load of 1 kg. Thereafter, each of the glass substrates was pulled so that an adhesive strength at a time when each of the glass substrates were stripped from each of the silicon wafers was found by use of a vertical model motorized stand "MX-500N" (manufactured by IMADA CO., LTD.).

(Evaluation of Flexibility)

After the adhesive compositions were applied on 6-inch silicon wafers, respectively, by use of a spinner at a speed of 1000 rpm for 25 seconds, each of the adhesive compositions was heated on a hotplate at a temperature of 200° C. for three minutes. As such, each coated film layer on each of the silicon wafer was obtained. Subsequently, whether or not there were cracks on the coated film layers was observed; a coated film layer that had a crack was evaluated as "P", and a coated film layer that did not have a crack was evaluated as "G". Note that the silicon wafers that were used had a thickness of 15 µm.

(Evaluation of Alkali Resistance)

The alkaline resistance was evaluated as follows. After the adhesive compositions according to Examples 1 and 2 and Comparative Example 1 were applied on the silicon wafers, respectively, the adhesive compositions thus applied were dried at a temperature of 200° C. for three minutes. Next, these dried adhesive compositions were immersed in a 2.38 mass % TMAH (tetramethyl ammonium hydroxide) aqueous solution. Subsequently, it was observed by visual inspection whether or not the applied films melted. If the melting of the applied film was not observed, the adhesive composition was evaluated as "G"; if the melting was observed, the adhesive composition was evaluated as "P".

(Evaluation of Adhesion)

The adhesion of each of the adhesive compositions of Examples 1 and 2 and Comparative Example 1 was evaluated at temperatures 23° C., 60° C., 120° C., 140° C., 160° C., 180° C., and 200° C. Specifically, the adhesive compositions of Example 1 and Comparative Example 1 were applied on silicon wafers, respectively, and heated at a temperature of 200° C. for three minutes, so as to form adhesive layers, respectively. Further, glass plates were attached to a respective of the adhesive layers by thermocompression at a temperature of 150° C. for two minutes. Then, the glass plate was pulled off under various temperature environments so that whether or not the adhesive composition remained on the silicon wafer was observed. If there was no residue of the adhesive composition, the adhesiveness was evaluated as "G"; if there was a residue of the adhesive composition, the adhesiveness was evaluated as "P". Furthermore, surfaces of the silicon wafers from which the glass plates had been detached, were observed by use of an optical microscope (MX50, manufactured by Olympus Corporation) at 50-fold magnification.

Examples 1 and 2, Comparative Example 1

The properties of the following two kinds of adhesive compositions were compared: (i) an adhesive composition (Comparative Example 1) including, as a main component, a polymer produced by copolymerization of a monomer composition including styrene, a (meth)acrylic acid alkyl ester having a chain structure, and a (meth)acrylic acid ester having an aromatic ring; and (ii) adhesive compositions (Examples 1 and 2) in which the above monomer composition further includes a (meth)acrylic acid ester having an aliphatic ring so that the glass transition temperature to be achieved would be improved and in which the composition of the monomer composition of the components was adjusted so that the heat resistance and the like would be ensured.

Table 1 shows (i) compositions of the monomer compositions obtained in Examples 1 and 2 and Comparative Example 1 and (ii) average molecular weights of adhesive compositions, respectively obtained by polymerizing the monomer compositions of Example 1 and Comparative Example 1.

TABLE 1

| composition (parts by mass) | Example 1 | Example 2 | Comparative Example 1 |
| --- | --- | --- | --- |
| methyl methacrylate | 27 | 27 | 15 |
| n-butyl acrylate | 0 | 0 | 13 |
| styrene | 12 | 12 | 12 |
| phenoxyethyl acrylate | 3 | 3 | 20 |
| isobornyl methacrylate | 18 | 18 | 0 |
| acrylic acid | 5 | 0 | 0 |
| styrene (added later) | 40 | 40 | 40 |
| average molecular weight | 97000 | 82500 | 86000 |

The adhesive composition of Example 1 was obtained as follows:

Ninety grams of PGMEA serving as a solvent, as well as 3 g of phenoxyethyl acrylate, 27 g of methyl methacrylate, 12 g of styrene, 18 g of isobornyl methacrylate, and 5 g of acrylic acid, as listed in Table 1, each serving as a monomer, were charged in a 300-ml four-necked flask fitted with a reflux condenser, a stirrer, a thermometer, and a nitrogen inlet tube, and $N_2$ was blown into the flask. Polymerization was initiated by starting stirring. The mixture was stirred while being heated up to 90° C. Then, a mixed solution containing 13.33 g of PGMEA and 40 g of styrene and another mixed solution containing 13.33 g of PGMEA and 0.6 g of t-butyl peroxy 2-ethyl hexanoate (polymerization initiator) were dropped from a drop nozzle continuously for two hours. The drop speed was fixed. The amount of t-butyl peroxy 2-ethyl hexanoate was adjusted so that the adhesive composition of each example had its average molecular weight shown in Table 1.

The polymerization reaction liquid obtained when the dropping was completed was immediately aged at 90° C. for one hour, and then a mixed solution containing 83.34 g of PGMEA and 0.3 g of t-butyl peroxy 2-ethyl hexanoate was dropped into the reaction liquid for one hour. Subsequently, the polymerization reaction liquid was immediately aged further at 90° C. for one hour, and then 1.0 g of 1,1,3,3-tetramethylbutyl peroxy 2-ethyl hexanoate was put into the reaction liquid in a portion.

Then, the polymerization reaction liquid was immediately aged at 90° C. for three hours. After that, the polymerization reaction liquid was heated until reflux of the solvent was observed, and was then aged for one hour, whereby the polymerization was terminated.

The adhesive composition of Example 2 was obtained in the same manner as the adhesive composition of Example 1 above was obtained, except for the unuse of 5 g of acrylic acid.

The adhesive composition of Comparative Example 1 was obtained as follows:

Ninety grams of PGMEA serving as a solvent, as well as 20 g of phenoxyethyl acrylate, 15 g of methyl methacrylate, 13 g of n-butyl acrylate, and 12 g of styrene, as listed in Table 1, each serving as a monomer, were charged in a 300-ml four-necked flask fitted with a reflux condenser, a stirrer, a thermometer, and a nitrogen introduction tube, and $N_2$ was blown into the flask. Polymerization was initiated by starting stirring. The mixture was stirred while being heated up to 90° C. Then, a mixed solution containing 13.33 g of PGMEA and 40 g of styrene and another mixed solution containing 13.33 g of PGMEA and, as a polymerization initiator, 0.6 g of t-butyl peroxy 2-ethyl hexanoate were dropped from a dropping nozzle continuously for two hours. The drop speed was fixed during the dropping.

The polymerization reaction liquid obtained when the dropping was completed was immediately aged at 90° C. for one hour, and then a mixed solution containing 83.34 g of PGMEA and 0.3 g of t-butyl peroxy 2-ethyl hexanoate was dropped into the reaction liquid for one hour. Subsequently, the polymerization reaction liquid was immediately aged further at 90° C. for one hour, and then 1.0 g of 1,1,3,3-tetramethylbutyl peroxy 2-ethyl hexanoate was put into the reaction liquid in a portion.

Then, the polymerization reaction liquid was immediately aged at 90° C. for three hours. After that, the polymerization reaction liquid was heated until reflux of the solvent was observed, and was then aged for one hour, whereby the polymerization was terminated.

Table 2 compares the adhesive compositions of Examples 1 and 2 and Comparative Example 1 in terms of the following properties: adhesive strength at 140° C., generated gas, heat resistance, flexibility, moisture absorbency, and alkali resistance.

TABLE 2

| evaluation result | Example 1 | Example 2 | Comparative Example 1 |
|---|---|---|---|
| adhesive strength under high-temperature environment (140° C.) | G | G | P |
| generated gas | G | G | G |
| heat resistance | G | G | G |
| flexibility | G | G | G |
| moisture absorbency | G | G | G |
| alkali resistance | G | G | G |

Figure 1:
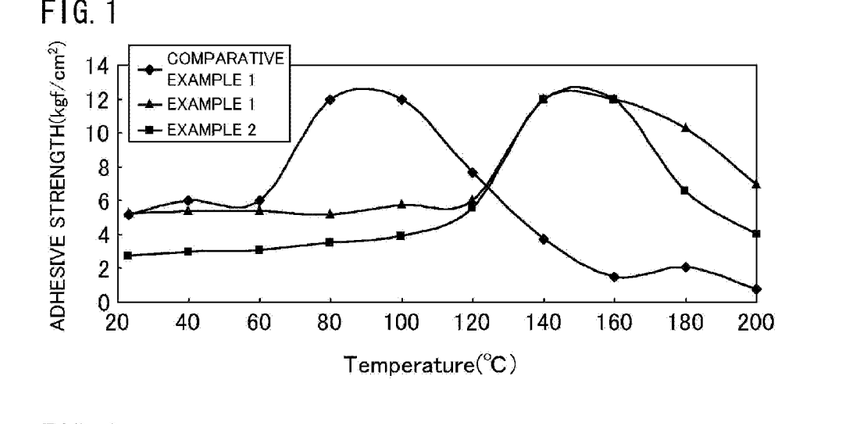
FIG. 1 is a view illustrating the result of comparison of adhesive strength between adhesive compositions of the examples of the present invention under different temperature conditions.

Table 3 and FIG. 1 compare the adhesive compositions of Examples 1 and 2 and Comparative Example 1 in terms of adhesive strength. In FIG. 1, the lateral axis shows the temperature conditions, whereas the longitudinal axis shows the adhesive strength (kgf/cm$^2$).

Figure 2:
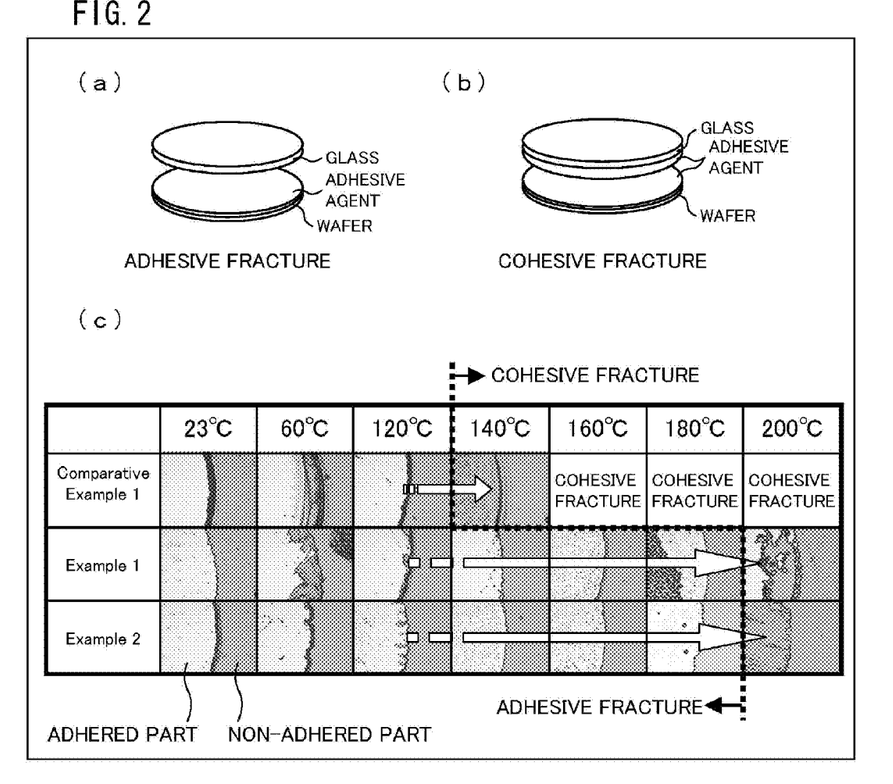
FIG. 2 is a view illustrating the result of comparison of adhesiveness between the adhesive compositions of the examples of the present invention.

The following describes the result of comparison of adhesiveness in more detail with reference to FIG. 2. FIG. 2 is a view schematically illustrating the result of comparison of adhesiveness. Pulling a glass plate, which adheres to a silicon wafer by means of an adhesive composition, off the silicon wafer results in the state of either of (a) and (b) of FIG. 2. (a) of FIG. 2 schematically illustrates the state in which the adhesive composition is stripped off by adhesive fracture, the state corresponding to "G" in Table 4. (b) of FIG. 2 schematically illustrates the state in which the adhesive composition is stripped off by cohesive fracture due to its liquefaction, the state corresponding to "P" in Table 4.

(c) of FIG. 2 is a view illustrating the results of observing the surface of the silicon wafer with an optical microscope after the adhesiveness was evaluated under various temperature conditions. As shown, for example, in a column of 23° C. of Example 2, a region (adhered part) to which the adhesive composition was applied is shown on the left side, and a region (non-adhered part) to which the adhesive composition was not applied is shown on the right side.

The temperatures under which measurements were made of the adhesive strength were arranged in ascending order as indicated by the arrow in (c) of FIG. 2. No adhesive composition remained in the sections corresponding to "G" in Table 4. This demonstrated that the adhesive composition was stripped off by adhesive fracture. On the other hand, the adhesive composition remained in the sections corresponding to "P" in Table 4. This demonstrates that the adhesive composition was stripped off by cohesive fracture.

As is clear from the above, the adhesive compositions of Examples 1 and 2 had adhesive fracture even at 180° C. This shows that the adhesive compositions had good adhesiveness. In contrast, the adhesive composition of Comparative Example 1 had cohesive fracture at 140° C. This shows that the adhesive composition had poor adhesion.

According to the adhesive composition of the present invention, the inclusion of the (meth)acrylic acid ester having an aliphatic ring in the monomer composition as described above raises the glass transition temperature of the adhesive composition to be obtained. This provides the adhesive com-

TABLE 3

| | adhesive strength under different temperature conditions (kgf/cm$^2$) | | | | | | | | | |
|---|---|---|---|---|---|---|---|---|---|---|
| | 23° C. | 40° C. | 60° C. | 80° C. | 100° C. | 120° C. | 140° C. | 160° C. | 180° C. | 200° C. |
| Comparative Example 1 | 5.2 | 6.0 | 6.0 | 12.0 | 12.0 | 7.7 | 3.7 | 1.5 | 2.1 | 0.8 |
| Example 1 | 5.2 | 5.4 | 5.4 | 5.2 | 5.8 | 6.0 | 12.0 | 12.0 | 10.3 | 6.9 |
| Example 2 | 2.9 | 3.0 | 3.2 | 3.8 | 4.0 | 4.8 | 12.0 | 12.0 | 6.5 | 4.0 |

Table 4 compares the adhesive compositions of Examples 1 and 2 and Comparative Example 1 in terms of adhesiveness.

position with high adhesive strength under high-temperature environment. In addition, the other components ensure high

TABLE 4

| | adhesiveness under different temperature conditions | | | | | | |
|---|---|---|---|---|---|---|---|
| | 23° C. | 60° C. | 120° C. | 140° C. | 160° C. | 180° C. | 200° C. |
| Comparative Example 1 | G | G | G | P | P | P | P |
| Example 1 | G | G | G | G | G | G | P |
| Example 2 | G | G | G | G | G | G | P | heat resistance and high alkali resistance, as well as easiness in stripping after the high-temperature processing. This consequently allows for provision of an adhesive composition having high adhesive strength under high-temperature environment and excelling in heat resistance, alkali resistance, and easiness in stripping.

Further, the adhesive composition of the present invention includes, as a main component, a polymer produced by copolymerization of the monomer composition including the above components in their respective contents. This further allows for provision of an adhesive composition that has superior flexibility and suppressed moisture absorbency.

The adhesive film of the present invention includes an adhesive layer containing the adhesive composition on a film as described above. This allows for provision of an adhesive film having high adhesive strength under high-temperature environment, as well as high heat resistance, high alkali resistance, and easiness in stripping after high-temperature processing.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

An adhesive composition and a film adhesive according to the present invention (i) have high heat resistance, alkaline resistance, and low moisture absorbency, (ii) generates little gas when heated, and (iii) can be easily stripped off by use of a stripping solution. Hence, the adhesive composition and the film adhesive according to the present invention can be suitably used in processing of a semiconductor wafer or a chip, which processing includes a high temperature process, a high vacuum process, and a process which uses various chemicals such as alkaline.

The invention claimed is:

1. An adhesive composition comprising, as a main component, a polymer produced by copolymerization of a monomer composition including:

styrene;

at least one (meth)acrylic acid alkyl ester having a chain structure;

a (meth)acrylic acid ester having an aliphatic ring; and a (meth)acrylic acid ester having an aromatic ring, wherein the (meth)acrylic acid ester having the aliphatic ring is a compound represented by the following formula (2)

(2)

wherein $R^3$ is a hydrogen atom or a methyl group; and $R^4$ is a C4 to C15 organic group having an aliphatic ring, wherein:

the styrene is contained in a range of 40 to 69 parts by mass;

the (meth)acrylic acid alkyl ester having the chain structure is contained in a range of 20 to 30 parts by mass;

the (meth)acrylic acid ester having the aliphatic ring is contained in a range of 10 to 25 parts by mass; and the (meth)acrylic acid ester having the aromatic ring is contained in a range of 1 to 5 parts by mass, where the amount of styrene, the (meth)acrylic acid alkyl ester having the chain structure, the (meth)acrylic acid ester having the aliphatic ring, and the (meth)acrylic acid ester having the aromatic ring is based on 100 parts by mass of the total monomer composition, and the polymer has a glass transition temperature in a range of 65° C. to 95° C.

2. The adhesive composition according to claim 1, wherein the at least one (meth)acrylic acid alkyl ester having the chain structure comprises a compound having a structure represented by the following formula (1):

(1)

(1)

wherein $R^1$ is a hydrogen atom or a methyl group; and $R^2$ is a C1 to C3 alkyl group.

3. The adhesive composition according to claim 2, wherein the compound represented by the formula (1) is methyl methacrylate.

4. The adhesive composition according to claim 2, wherein, the compound represented by the formula (1) is contained in a range of 50 to 100 parts by mass, based on a total amount of the at least one (meth)acrylic acid alkyl ester having a chain structure being 100 parts by mass.

5. The adhesive composition according to claim 1, wherein the (meth)acrylic acid ester having the aliphatic ring is isobornyl methacrylate.

6. The adhesive composition according to claim 1, wherein the (meth)acrylic acid ester having the aromatic ring is a compound represented by the following formula (3):

wherein $R^5$ is a hydrogen atom or a methyl group; and $R^6$ is a C6 to C15 organic group having an aromatic ring.

7. The adhesive composition according to claim 1, wherein the (meth)acrylic acid ester having the aromatic ring is phenoxyethyl acrylate.

8. The adhesive composition according to claim 1, wherein the monomer composition further includes a carboxylic acid having an ethylenic double bond.

9. The adhesive composition according to claim 8, wherein the carboxylic acid is a (meth)acrylic acid.

10. The adhesive composition according to claim 8, wherein,
the carboxylic acid is contained in a range of 1 to 10 parts by mass,
based on the total amount of the styrene, the (meth)acrylic acid ester having the aromatic ring, the (meth)acrylic acid alkyl ester having the chain structure, and the (meth)acrylic acid ester having the aliphatic ring being 100 parts by mass.

11. An adhesive film comprising, on a film, an adhesive layer including the adhesive composition according to claim 1.

* * * * *